(12) United States Patent
Xiang et al.

(10) Patent No.: US 6,255,219 B1
(45) Date of Patent: Jul. 3, 2001

(54) METHOD FOR FABRICATING HIGH-PERFORMANCE SUBMICRON MOSFET WITH LATERAL ASYMMETRIC CHANNEL

(75) Inventors: Qi Xiang, Santa Clara; Wei Long, Sunnyvale, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/391,303

(22) Filed: Sep. 7, 1999

(51) Int. Cl.[7] .................................................. H01L 21/00

(52) U.S. Cl. ........................... 438/705; 438/745; 438/756

(58) Field of Search ..................................... 438/705, 723, 438/743, 745, 756, 179, 197, 231; 216/87, 99

(56) References Cited

U.S. PATENT DOCUMENTS

| | | | |
|---|---|---|---|
| 6,043,157 | * 3/2000 | Gardner et al. | 438/719 X |
| 6,083,846 | * 7/2000 | Fulford et al. | 438/719 X |
| 6,107,211 | * 8/2000 | Tseng | 438/719 X |

OTHER PUBLICATIONS

"A High Performance 0.1 $\mu$m MOSFET with Asymmetric Channel Profile," Akira Hiroki, Shinji Odanaka, and Atsushi Hori, *IEEE 1995*.

* cited by examiner

*Primary Examiner*—William Powell
(74) *Attorney, Agent, or Firm*—Sawyer Law Group LLP

(57) ABSTRACT

The present invention provides a method for fabricating a submicron metal-oxide semiconductor field-effect transistor (MOSFET). The method includes providing a gate on a substrate, the substrate having a source side and a drain side, the drain side having a spacer area; forming a spacer at the spacer area; and performing a halo implant at the source side and the drain side, wherein the spacer prevents implantation in the spacer area, wherein the spacer facilitates formation of a lateral asymmetric channel. In the preferred embodiment, the spacer is formed by depositing an oxide layer on the gate and substrate, and then avoiding nitrogen implantation of the oxide layer in the spacer area while implanting nitrogen in the remainder of the oxide layer. The difference in the etch rates of oxide implanted with nitrogen and oxide not implanted with nitrogen allows for a selective etch of the oxide layer, resulting in the spacer in the spacer area. A lateral asymmetric channel is thus formed, and the speed of the submicron MOSFET is increased.

9 Claims, 14 Drawing Sheets

METHOD FOR FABRICATING HIGH-PERFORMANCE SUBMICRON MOSFET WITH LATERAL ASYMMETRIC CHANNEL

FIELD OF THE INVENTION

The present invention relates to semiconductor devices, and more particularly to the fabrication of submicron semiconductor devices.

BACKGROUND OF THE INVENTION

Semiconductor devices include deep-submicron metal-oxide semiconductor fieldeffect transistors (MOSFET). FIG. 1 illustrates a conventional cell of a MOSFET. The cell 100 comprises a gate 102 on a substrate 104. The gate typically comprises a polysilicon layer 106 with a salicide layer 108 on top. Sidewall spacers 110 comprising oxide protect the gate 106. The cell 100 also comprises a salicide layer 112 and a silicon nitride layer 114 on the substrate 104 next to the spacers 110. In the substrate 104 on the source and drain sides are extensions 116, halo implanted areas 118, and the source 120 and drain 122 regions. The cell 100 has a lateral symmetric channel doping profile. However, as device dimensions are scaled down to the sub-100 nm regime, the speed of the device is not scaled in the same manner.

Accordingly, there exists a need for a method of fabrication of a submicron MOSFET which improves the speed of the device. The present invention addresses this need.

SUMMARY OF THE INVENTION

The present invention provides a method for fabricating a submicron metal-oxide semiconductor field-effect transistor (MOSFET). The method includes providing a gate on a substrate, the substrate having a source side and a drain side, the drain side having a spacer area; forming a spacer at the spacer area; and performing a halo implant at the source side and the drain side, wherein the spacer prevents implantation in the spacer area, wherein the spacer facilitates formation of a lateral asymmetric channel. In the preferred embodiment, the spacer is formed by depositing an oxide layer on the gate and substrate, and then avoiding nitrogen implantation of the oxide layer in the spacer area while implanting nitrogen in the remainder of the oxide layer. The difference in the etch rates of oxide implanted with nitrogen and oxide not implanted with nitrogen allows for a selective etch of the oxide layer, resulting in the spacer in the spacer area. A lateral asymmetric channel is thus formed, and the speed of the submicron MOSFET is increased.

DETAILED DESCRIPTION

The present invention provides a method of fabrication of a submicron MOSFET which improves the speed of the device. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

The method in accordance with the present invention improves the speed of the device by providing a method for fabricating a submicron MOSFET with a lateral asymmetric channel. To more particularly describe the features of the present invention, please refer to FIGS. 2 through 4 in conjunction with the discussion below.

Figure 1:
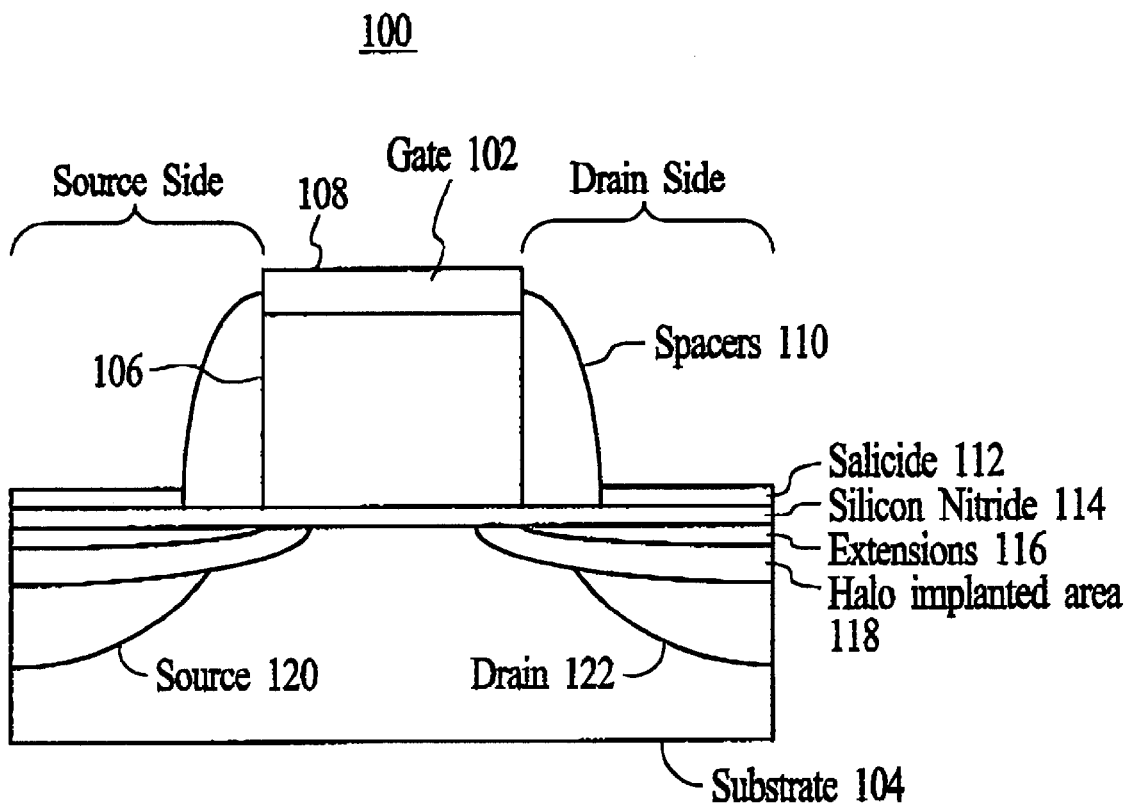
FIG. 1 illustrates a conventional cell of a MOSFET.
Figure 2:
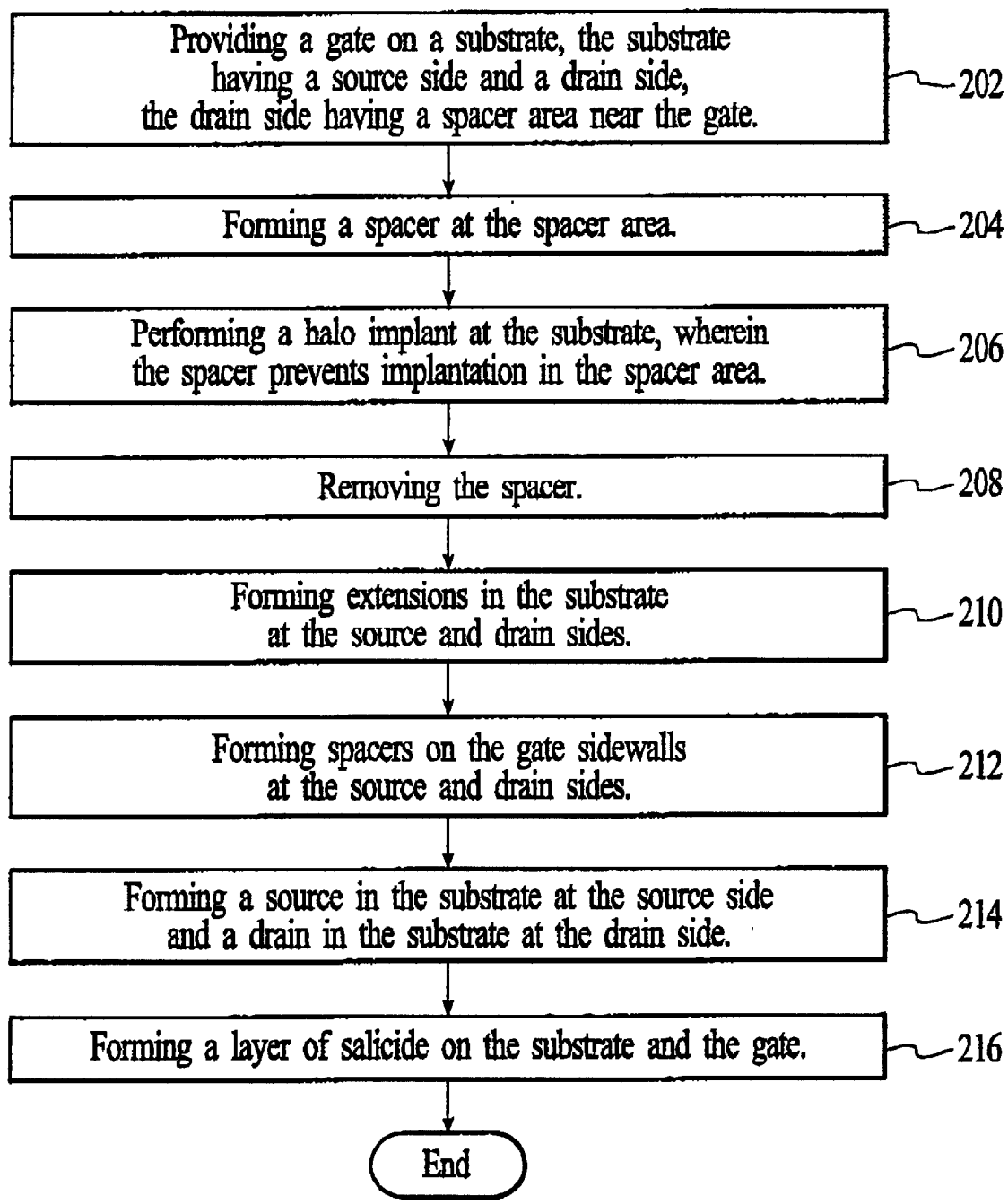
FIG. 2 is a flow chart illustrating a preferred embodiment of a method for fabricating a submicron MOSFET in accordance with the present invention.

FIG. 2 is a flow chart illustrating a preferred embodiment of a method for fabricating a submicron MOSFET in accordance with the present invention. First, a gate is provided on a substrate, via step 202. The substrate next to the gate has a source side and a drain side. In the drain side is a spacer area near the gate. Next, a spacer is formed in the spacer area, via step 204. No spacer is formed in the source side. Next, a halo implantation is performed at the substrate, via step 206. The spacer, however, prevents the halo implantation in the spacer area. Then the spacer is removed, via step 208. Next, extensions are formed in the substrate at the source and drain sides, via step 210. Next, spacers are formed at the sidewalls of the gate at the source and drain sides, via step 212. The source region in the source side and the drain region in the drain side are then formed, via step 214. Then, a layer of salicide is formed on the substrate and the gate, via step 216. A MOSFET cell with a lateral asymmetric channel results.

Figure 3A:
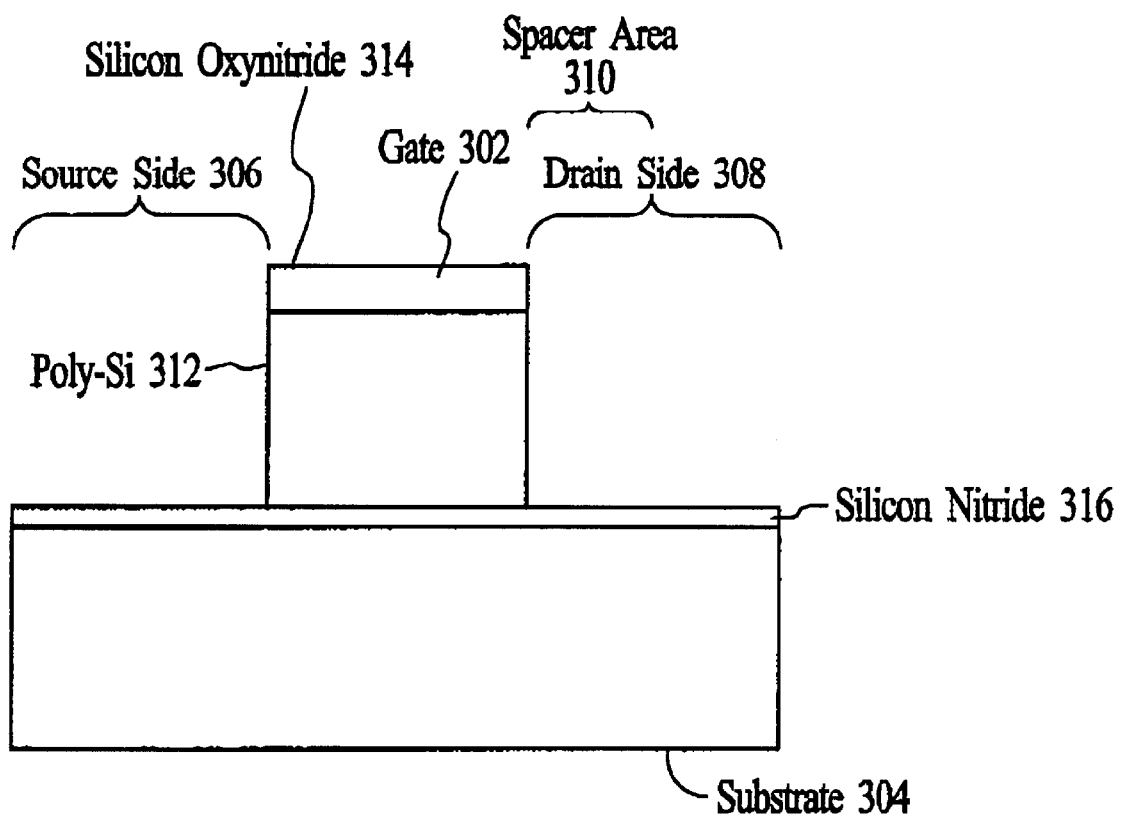
FIGS. 3A–3K illustrate cross-sections of a submicron MOSFET in demonstration of the preferred embodiment of the method for fabricating a submicron MOSFET in accordance with the present invention.

FIGS. 3A–3K illustrate cross-sections of a submicron MOSFET in demonstration of the preferred embodiment of the method for fabricating a submicron MOSFET in accordance with the present invention. First, as illustrated in FIG. 3A, a gate 302 is provided on substrate 304, via step 202. The substrate 304 has a source side 306 and a drain side 308. The drain side 308 includes a spacer area 310 near the gate 302. In the preferred embodiment, the gate 302 comprises a polysilicon layer 312 and a silicon oxynitride layer 314 on the polysilicon layer 312. A layer of silicon nitride 316 resides on the top of the substrate 304.

Figure 3B:
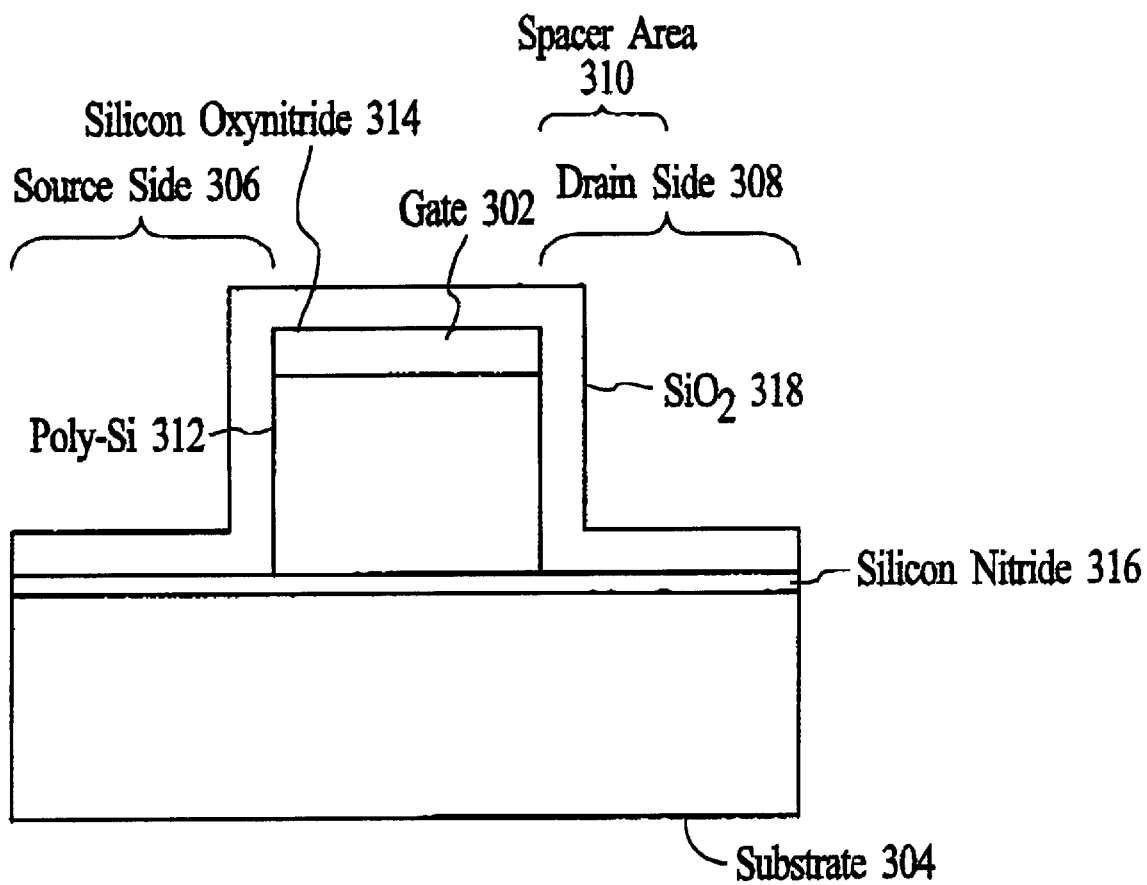
Figure 3C:
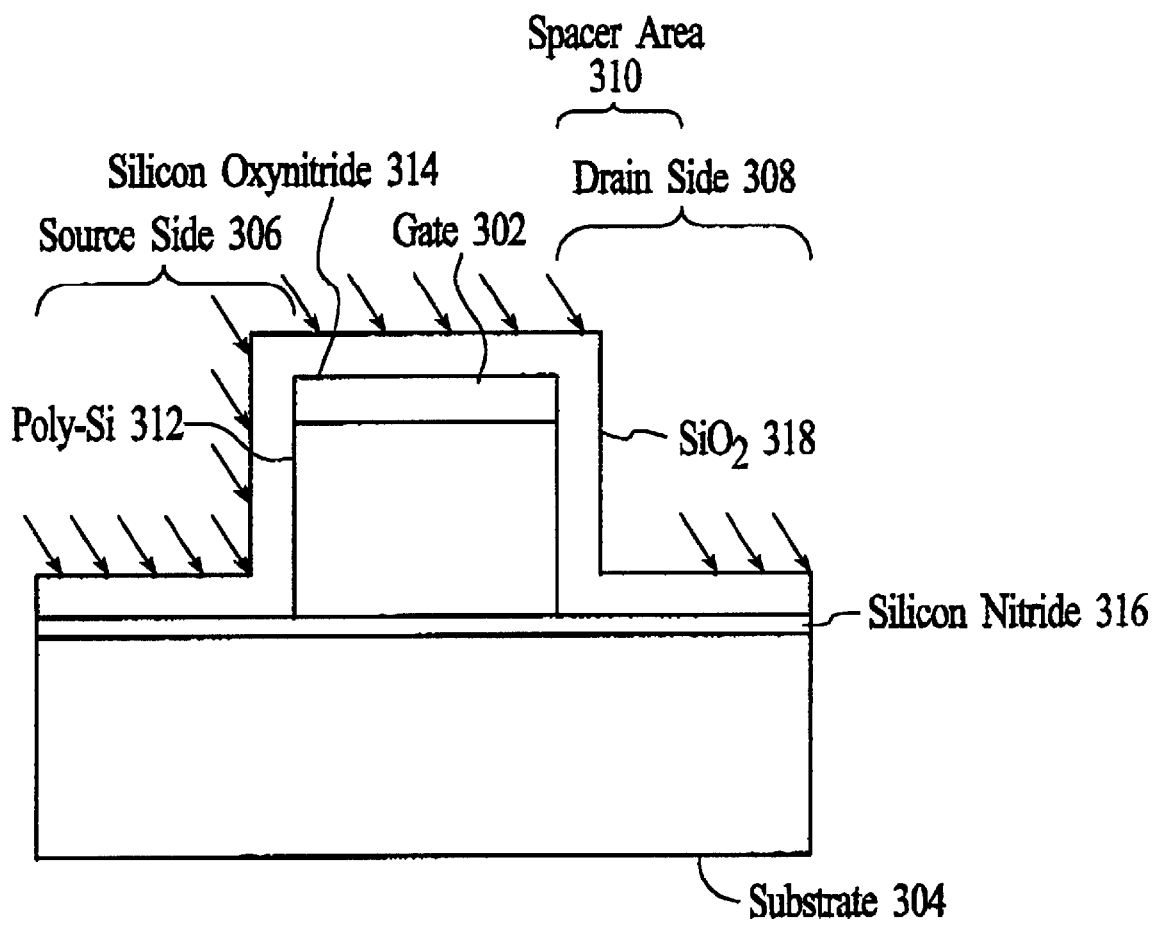
Figure 3D:
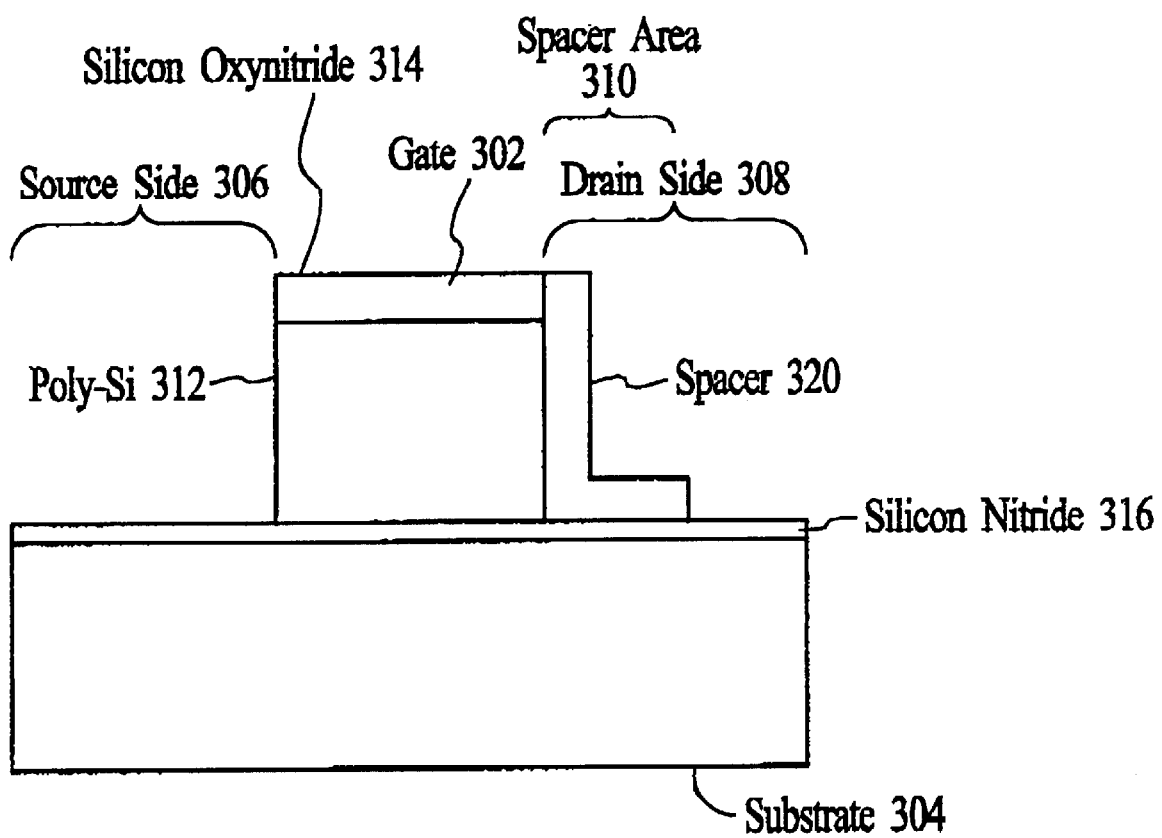
Figure 4:
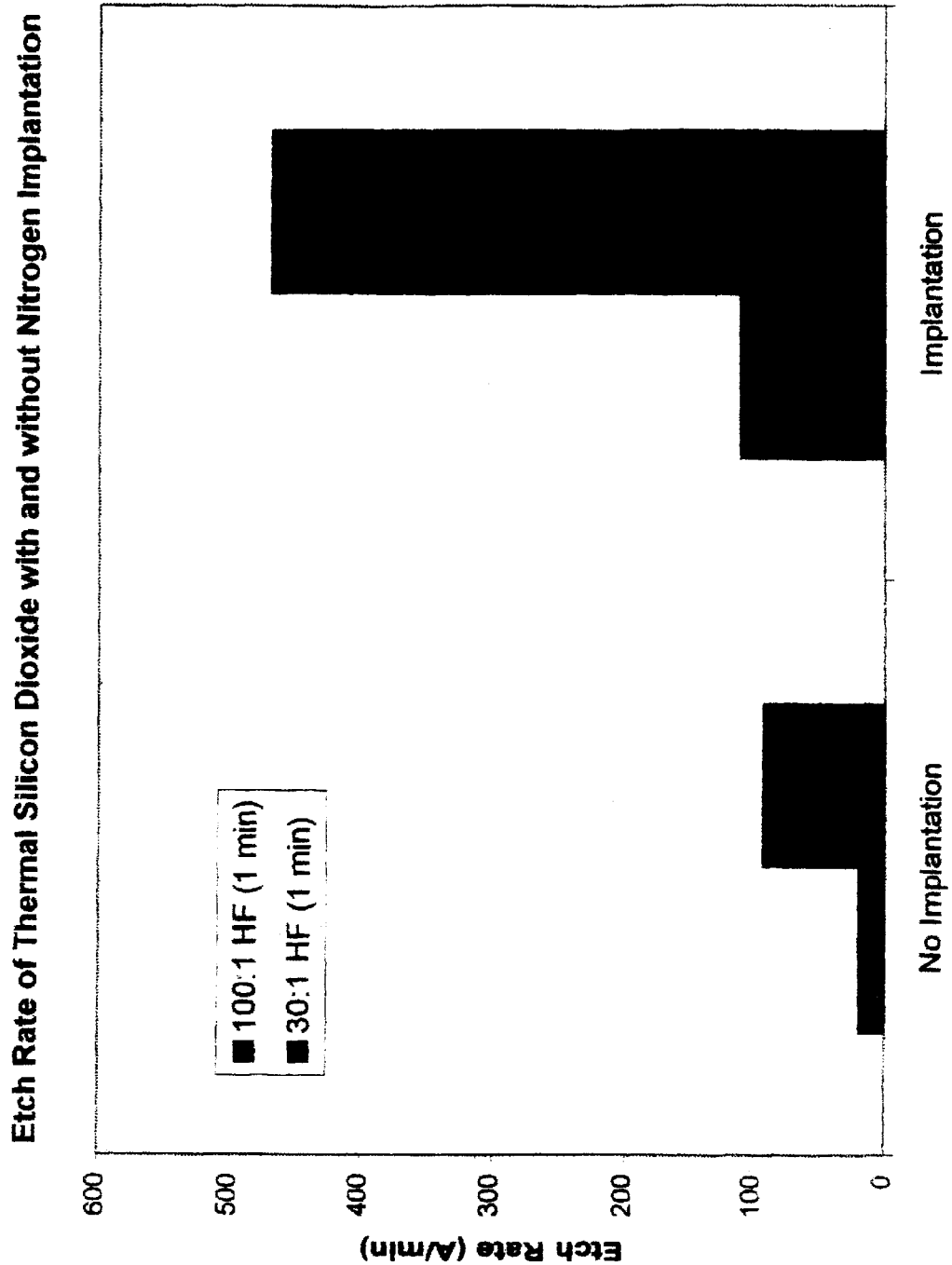
FIG. 4 is a graph illustrating the etch rates of thermal silicon dioxide with and without nitrogen implantation.

FIGS. 3B through 3D illustrate the forming of the spacer in the spacer area, via step 204. First, as illustrated in FIG. 3B, an oxide layer 318 is deposited on the gate 302 and the substrate 304. In the preferred embodiment, the oxide layer 318 comprises silicon dioxide ($SiO_2$). Next, as illustrated in FIG. 3C, an angled implant is performed on the oxide layer 318. In the preferred embodiment, the oxide layer 318 is implanted with nitrogen. Because the implant is angled, the oxide in the spacer area 310 is not implanted. As illustrated in FIG. 3D, an etch, such as an HF etch, is then performed to remove most of the oxide layer 318. Experiments have shown that oxide implanted with nitrogen has a significantly higher etch rate than oxide not implanted with nitrogen. FIG. 4 is a graph illustrating the etch rates of thermal silicon dioxide with and without nitrogen implantation. For a one minute etch using a 100:1 $H_2O$ to HF solution, the etch rate for $SiO_2$ with no nitrogen implantation is under 50 Å/min, while the etch rate for $SiO_2$ with nitrogen implantation is over 100 Å/min. For a one minute etch using a 30:1 $H_2O$ to HF solution, the etch rate for $SiO_2$ with no nitrogen implantation is over 100 Å/min, while the etch rate for $SiO_2$ with nitrogen implantation is about 500 Å/min. Thus, the HF etch of part of the oxide layer 318 with the nitrogen implant occurs significantly faster than the part of the oxide layer in the spacer area 310 with no nitrogen implant. The angled nitrogen implantation essentially allows a selective etch of the oxide layer 318 which leaves a spacer 320 in the spacer area 310 while removing the remainder of the oxide layer 318.

Figure 3E:
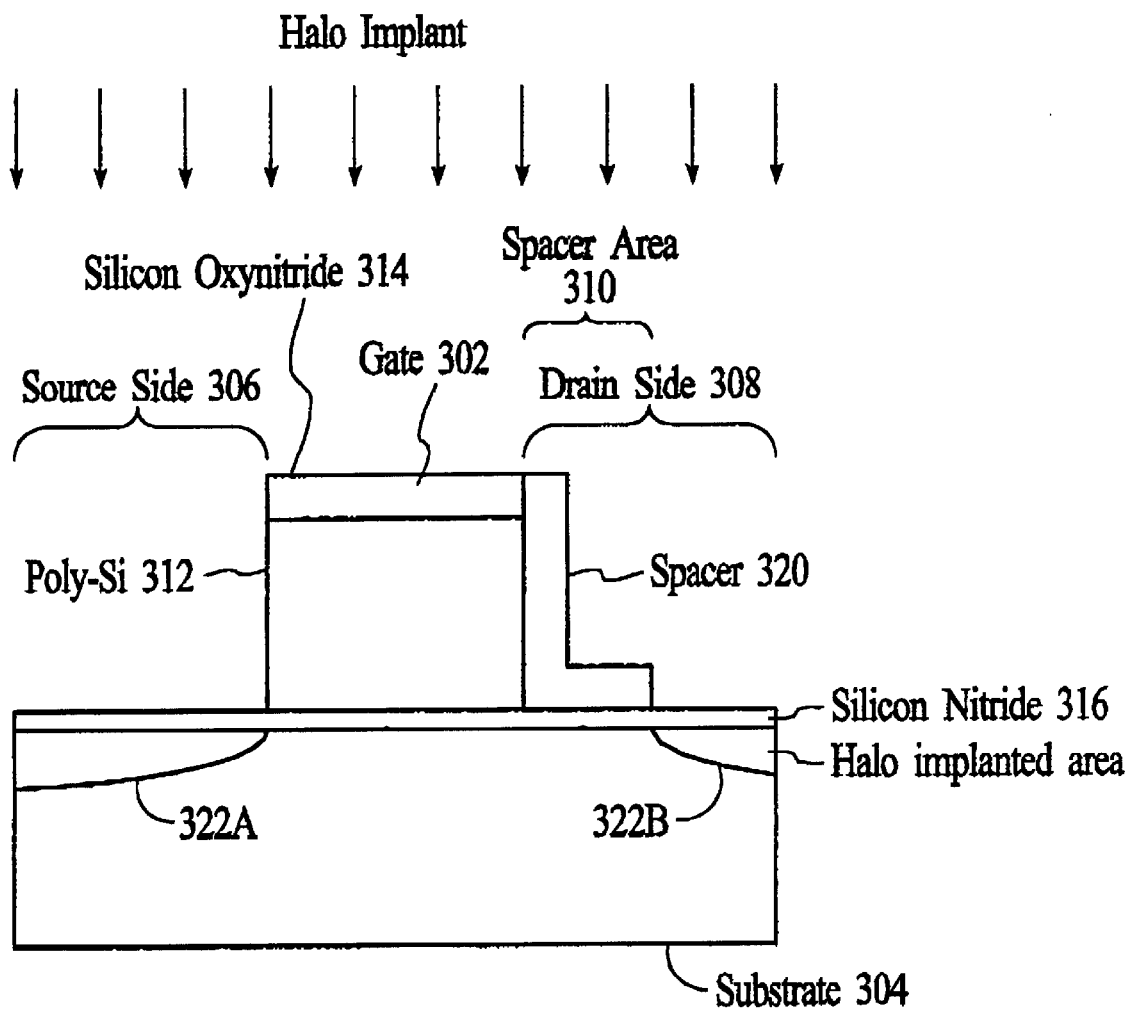
Figure 3F:
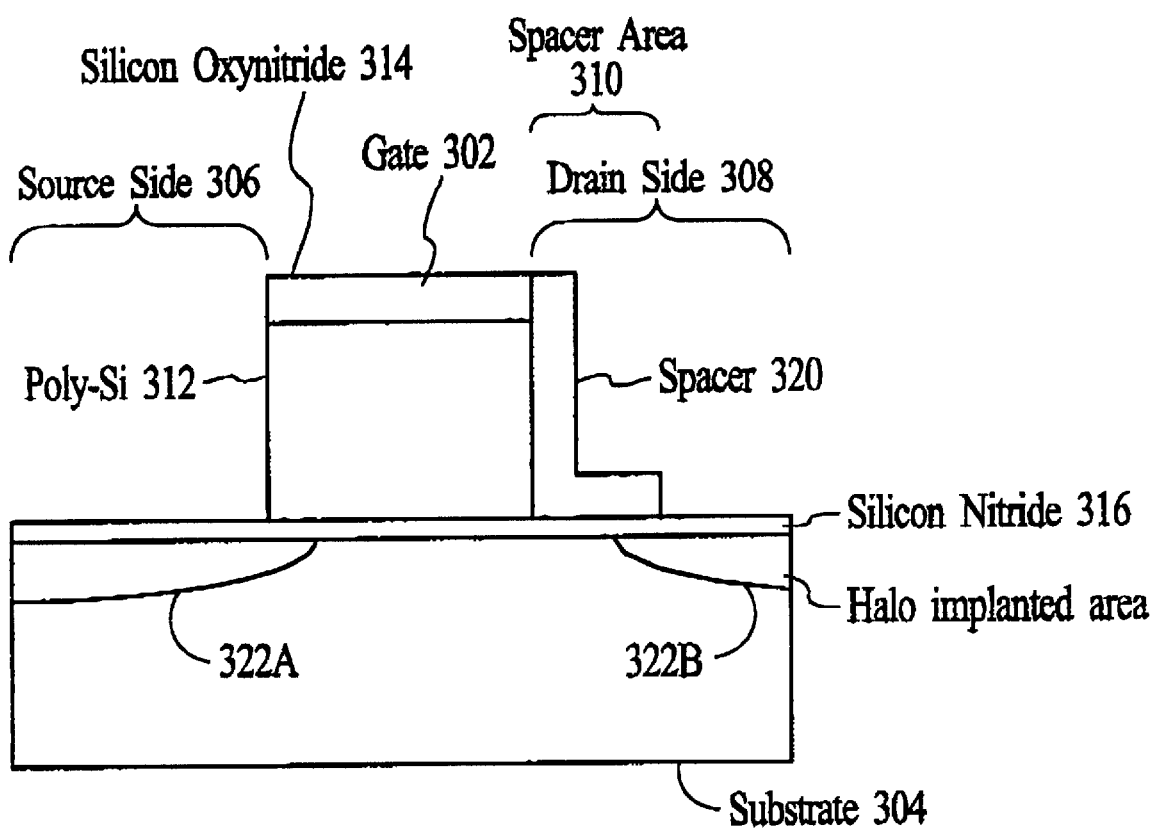

Once the spacer 320 is formed, as illustrated in FIG. 3E, a halo implantation is performed, via step 206. For example, in the preferred embodiment, for a p-type MOSFET, boron would be implanted. The halo implant results in halo implanted areas 322A and 322B in the source side 306 and the drain side 308, respectively. Because of the spacer 320, the substrate 304 in the spacer area 310 is blocked from the halo implant. The halo implantation areas are then annealed to drive the dopants into the channel, as illustrated in FIG. 3F. Because the spacer 320 blocked the halo implant in the spacer area 310 while the source side 306 was not so blocked, the resulting dopant in the channel has an asymmetric profile.

Figure 3G:
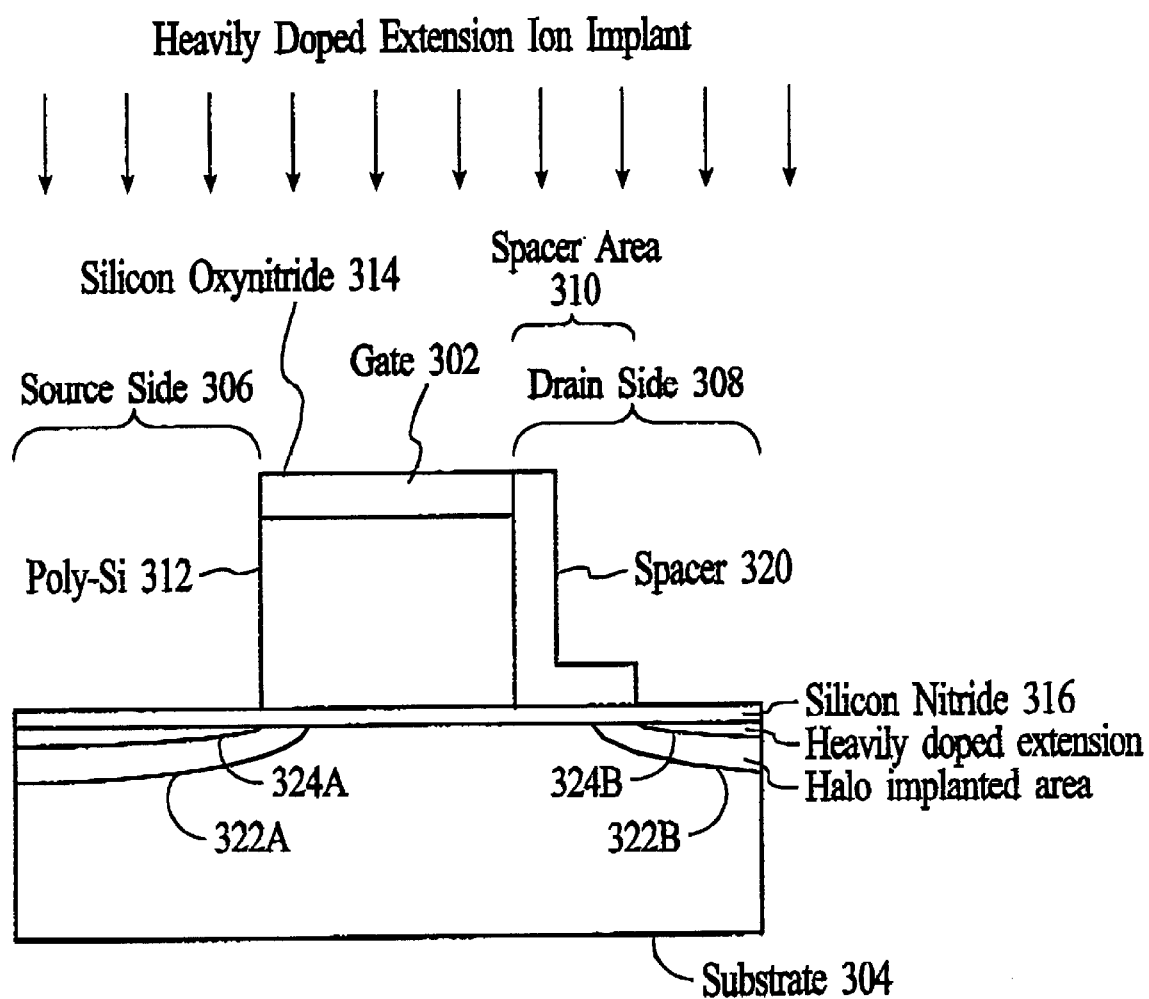
Figure 3H:
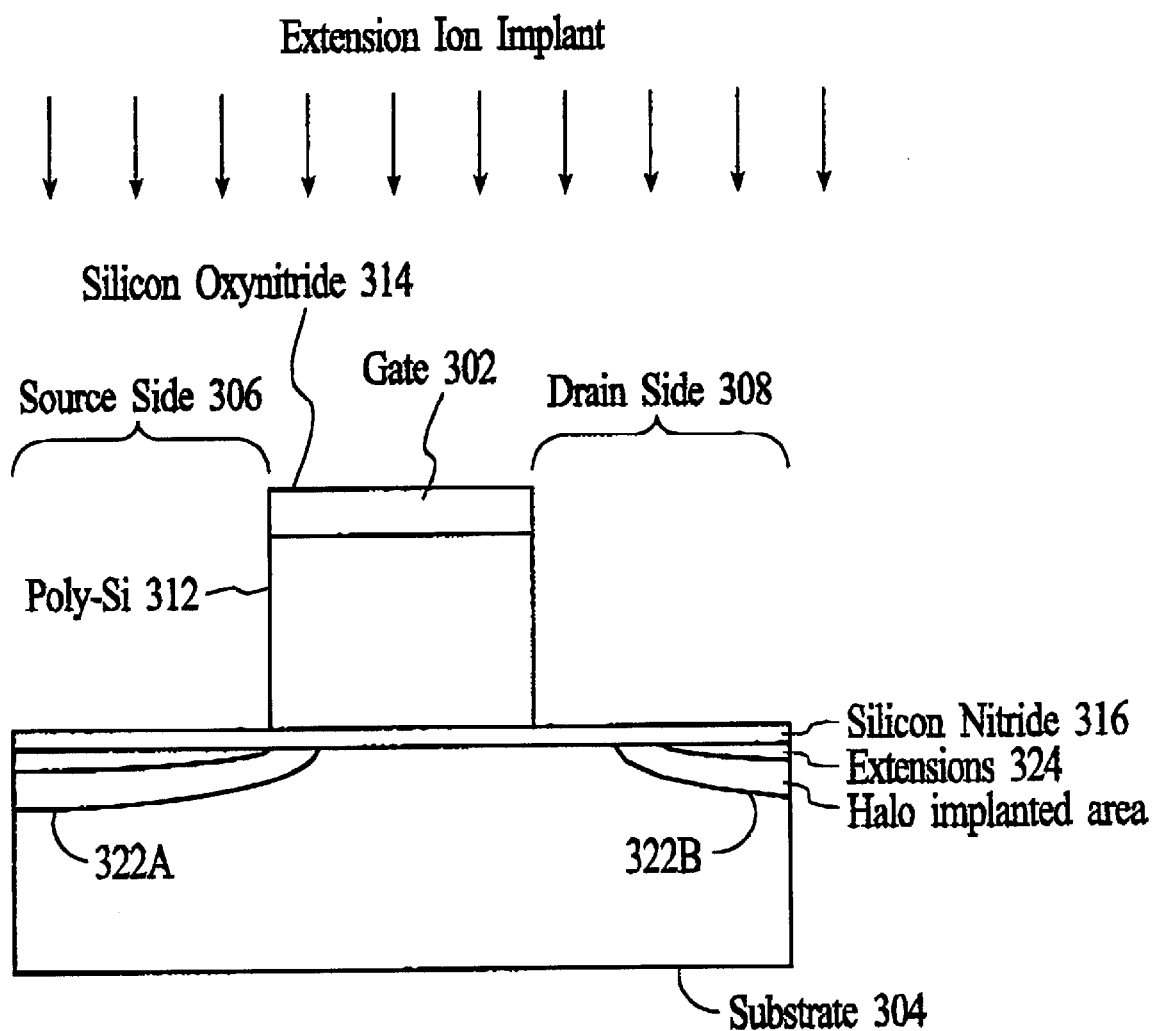
Figure 3I:
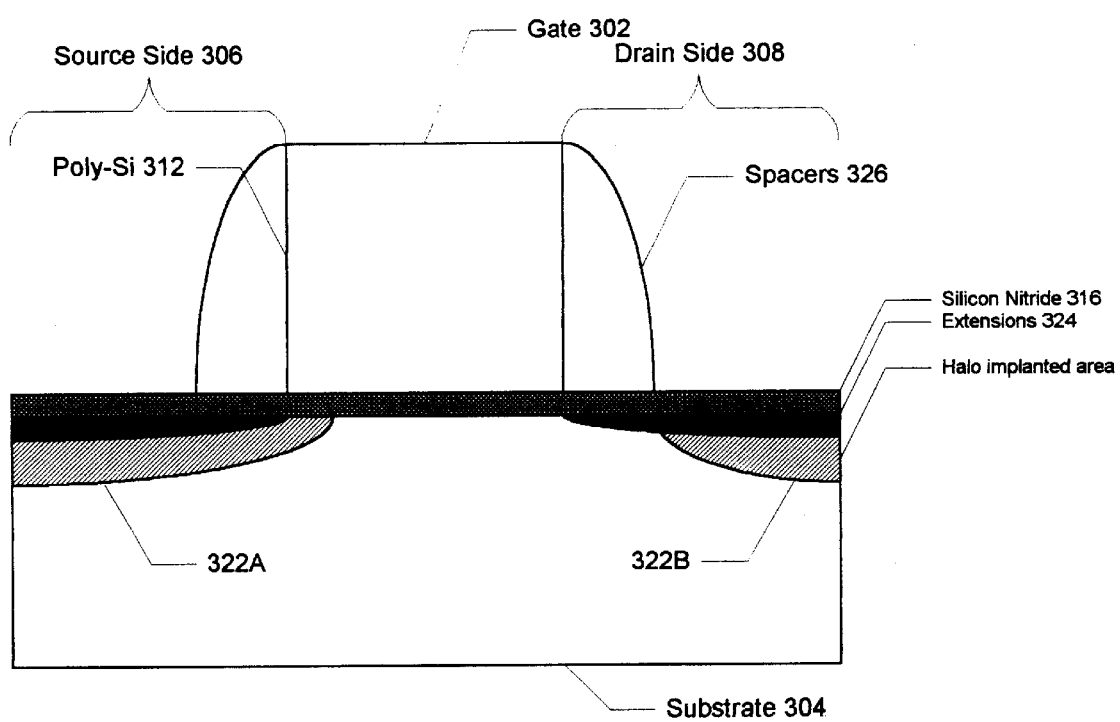

Next, the spacer 320 is removed, via step 208, as illustrated in FIG. 3G. Then, as illustrated in FIG. 3H, an extension ion implant is performed, via step 210, to form the extensions 324 in the substrate 304 at the source 306 and drain 308 sides. Spacers 326 are then formed on the sidewalls of the gate 302, via step 212 and illustrated in FIG. 3I. In the preferred embodiment, the spacers 326 are formed by first depositing an oxide layer over the gate 302 and the substrate 304, and then etching this oxide layer to form the spacers 326. The silicon oxynitride layer 314 is also removed at this time.

Figure 3J:
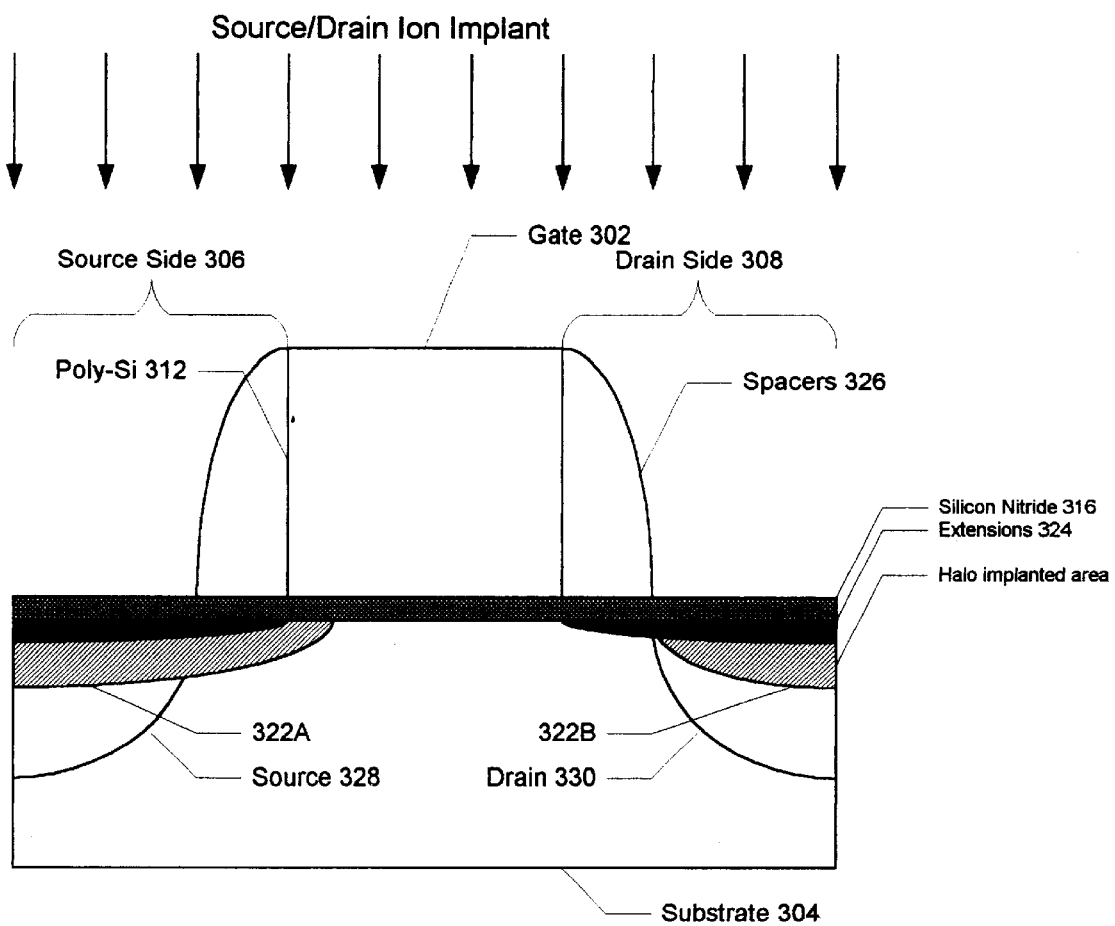
Figure 3K:
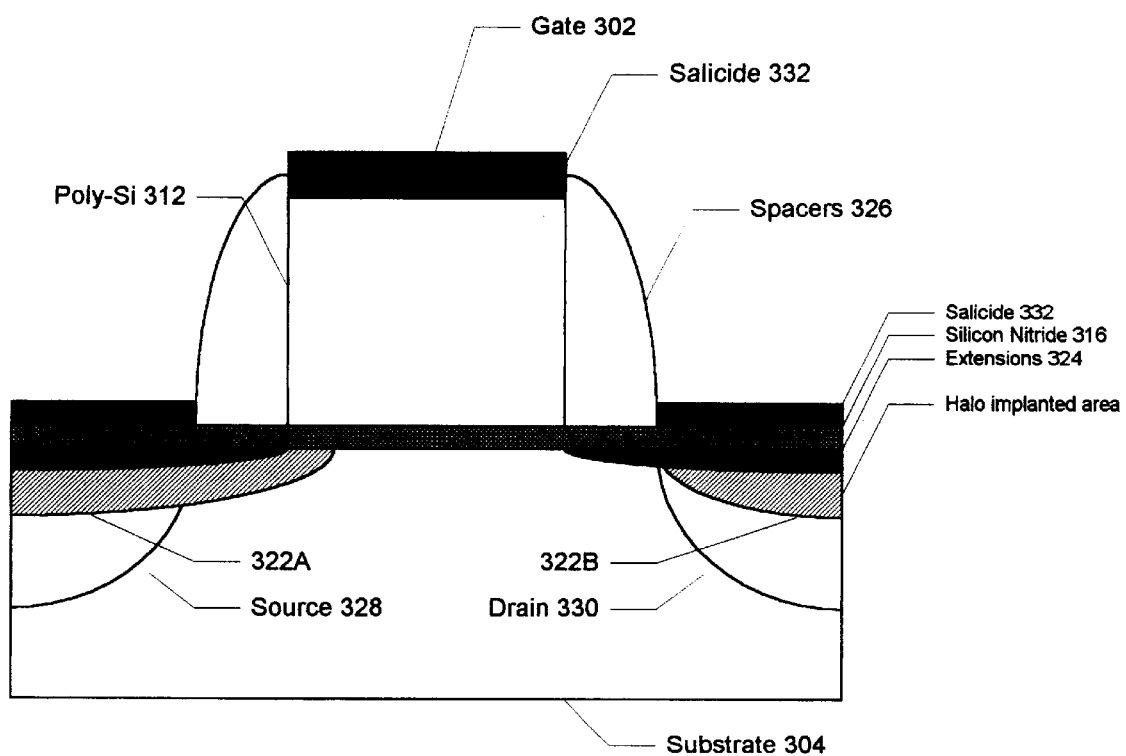

Next, the source 328 and the drain 330 are formed, via step 214. As illustrated in FIG. 3J, a source/drain junction ion implantation is performed which forms the source 328 in the source side 306 and the drain 330 in the drain side 308. Then, a salicide layer 332 is formed, via step 216, on the gate 302 and the substrate 304, as illustrated in FIG. 3K. In the preferred embodiment, the salicide layer 332 is formed by first depositing a layer of silicide on the gate 302 and the substrate 304. Examples of silicides which may be used include TiSi$_2$, CoSi$_2$, and NiSi. The silicide layer reacts with silicon, resulting in salicide 332 on the top of the gate 302 and the portions of the top of the substrate 304, as shown.

The resulting submicron MOSFET cell, illustrated in FIG. 3K, has a lateral asymmetric channel doping profile. The asymmetric channel creates a steep gradient of dopant along the channel, which in turn creates a rapid change in the electric field in the channel. The rapidly changing electric field accelerates electrons in the channel, triggering the occurrence of the velocity overshoot phenomenon. The velocity overshoot increases the speed of the device.

A method of fabrication of a submicron MOSFET which improves the speed of the device has been disclosed. The method increases the speed by creating a lateral asymmetric channel which triggers velocity overshoot in the channel. The lateral asymmetric channel is formed with the use of a spacer in the drain side but not in the source side during the halo implant. The spacer is formed by depositing an oxide layer on the gate and substrate, and then avoiding nitrogen implantation of the oxide layer in the spacer area while implanting nitrogen in the remainder of the oxide layer. The difference in the etch rates of oxide implanted with nitrogen and oxide not implanted with nitrogen allows for a selective etch of the oxide layer, resulting in the spacer in the spacer area. A lateral asymmetric channel is thus formed, and the speed of the submicron MOSFET is increased.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for fabricating a submicron metal-oxide semiconductor field-effect transistor (MOSFET), comprising the sequential steps of:

(a) providing a gate on a substrate, the substrate having a source side and a drain side, the drain side having a spacer area;

(b) forming a spacer at the spacer area; and (c) performing a halo implant at the source side and the drain side, wherein the spacer prevents implantation in the spacer area, wherein the spacer facilitates formation of a lateral asymmetric channel.

2. The method of claim 1, further comprising:

(d) removing the spacer;

(e) forming a plurality of extensions in the substrate at the source side and the drain side;

(f) forming a plurality of spacers on the gate sidewalls at the source side and the drain side;

(g) forming a source in the substrate at the source side and a drain in the substrate at the drain side; and (h) forming a layer of salicide on the substrate and the gate.

3. The method of claim 1, wherein the forming step (b) comprises the sequential steps of:

(b1) depositing an oxide layer on the gate and the substrate;

(b2) implanting nitrogen into a first portion of the oxide layer, wherein a second portion of the oxide layer in the spacer area is not implanted; and (b3) selectively etching the oxide layer, wherein the first portion of the oxide layer is etched, wherein a spacer is formed at the spacer area.

4. The method of claim 3, wherein the oxide layer comprises silicon dioxide.

5. The method of claim 3, wherein the selective etching of the oxide layer is facilitated by a difference in etch rates of the first portion of the oxide layer and the second portion of the oxide layer.

6. A method for fabricating a submicron MOSFET, comprising the sequential steps of:

(a) providing a gate on a substrate, the substrate having a source side and a drain side, the drain side having a spacer area;

(b) depositing an oxide layer on the gate and the substrate;

(c) implanting nitrogen into a first portion of the oxide layer, wherein a second portion in the spacer area is not implanted;

(d) selectively etching the oxide layer, wherein the first portion of the oxide layer is etched, wherein the selective etching is facilitated by a difference in etch rates of the first portion of the oxide layer and the second portion of the oxide layer, wherein a spacer is formed at the spacer area; and (e) performing a halo implant at the source side and the drain side, wherein the spacer prevents implantation in the spacer area, wherein the spacer facilitates formation of a lateral asymmetric channel.

7. The method of claim 6, further comprising:

(f) removing the spacer;

(g) forming a plurality of extensions in the substrate at the source side and the drain side;

(h) forming a plurality of spacers on the gate sidewalls at the source side and the drain side;

(i) forming a source in the substrate at the source side and a drain in the substrate at the drain side; and (j) forming a layer of salicide on the substrate and the gate.

8. The method of claim 6, wherein the oxide layer comprises silicon dioxide.

9. A method for fabricating a submicron metal-oxide semiconductor field-effect transistor (MOSFET), comprising the sequential steps of:

(a) providing a gate on a substrate, the substrate having a source side and a drain side, the drain side having a spacer area;

(b) depositing an oxide layer on the gate and the substrate;

(c) implanting nitrogen into a first portion of the oxide layer, wherein a second portion in the spacer area is not implanted;

(d) selectively etching the oxide layer, wherein the first portion of the oxide layer is etched, wherein the selective etching is facilitated by a difference in etch rates of the first portion of the oxide layer and the second portion of the oxide layer, wherein a spacer is formed at the spacer area;

(e) performing a halo implant at the source side and the drain side, wherein the spacer prevents implantation in the spacer area, wherein the spacer facilitates a formation of a lateral asymmetric channel;

(f) removing the spacer;

(g) forming a plurality of extensions in the substrate at the source side and the drain side;

(h) forming a plurality of spacers on the gate sidewalls at the source side and the drain side;

(i) forming a source in the substrate at the source side and a drain in the substrate at the drain side; and (j) forming a layer of salicide on the substrate and the gate.

* * * * *